United States Patent [19]
Werther

[11] Patent Number: 5,712,768
[45] Date of Patent: Jan. 27, 1998

[54] SPACE-SAVING ASSEMBLIES FOR CONNECTING INTEGRATED CIRCUITS TO CIRCUIT BOARDS

[75] Inventor: William E. Werther, Wood Ranch, Calif.

[73] Assignee: Interconnect Systems, Inc., Simi Valley, Calif.

[21] Appl. No.: 548,674

[22] Filed: Oct. 26, 1995

Related U.S. Application Data

[62] Division of Ser. No. 998,476, Dec. 30, 1992, Pat. No. 5,479,319.

[51] Int. Cl.$^6$ ............................ H01R 23/68; H05K 1/11
[52] U.S. Cl. ...................... 361/767; 361/777; 361/784; 361/790; 439/75
[58] Field of Search ................... 174/52.1, 52.4, 174/260, 261; 257/700, 723, 724, 697, 726, 692, 727; 361/760, 767, 768–771, 774, 777, 780, 782, 783, 784, 785, 790, 791, 803; 439/68–71, 74, 75; 324/755, 537, 765, 538

[56] References Cited

U.S. PATENT DOCUMENTS

| | | | |
|---|---|---|---|
| 3,465,435 | 9/1969 | Steranko | 29/628 |
| 4,074,342 | 2/1978 | Honn et al. | 361/411 |
| 4,627,678 | 12/1986 | Biswas . | |
| 4,744,007 | 5/1988 | Watari et al. | 361/767 |
| 4,750,092 | 6/1988 | Werther | 361/400 |
| 4,761,881 | 8/1988 | Bora et al. | 29/840 |
| 4,773,955 | 9/1988 | Mabuchi et al. | 156/257 |
| 4,882,657 | 11/1989 | Braun | 361/790 |
| 4,908,696 | 3/1990 | Ishihara et al. | 257/723 |
| 4,965,227 | 10/1990 | Chang et al. | 174/50.51 |
| 4,970,577 | 11/1990 | Ogihara et al. | 257/723 |
| 4,975,765 | 12/1990 | Ackermann et al. | 257/723 |
| 4,996,585 | 2/1991 | Gruber et al. | 257/723 |
| 5,006,673 | 4/1991 | Freyman et al. | 174/255 |
| 5,018,005 | 5/1991 | Lin et al. | 257/723 |
| 5,036,431 | 7/1991 | Adachi et al. | 361/784 |
| 5,061,989 | 10/1991 | Yen et al. | 361/785 |
| 5,077,633 | 12/1991 | Freyman et al. | 361/403 |
| 5,089,881 | 2/1992 | Panicker | 257/723 |
| 5,093,282 | 3/1992 | Ohno et al. | 174/52.4 |
| 5,097,318 | 3/1992 | Tanaka et al. | 257/723 |
| 5,102,829 | 4/1992 | Cohn | 437/217 |
| 5,109,269 | 4/1992 | Holzman | 257/723 |

(List continued on next page.)

FOREIGN PATENT DOCUMENTS

| | | | |
|---|---|---|---|
| 539075-A1 | 4/1993 | European Pat. Off. . | |
| 59-125641 | 7/1984 | Japan | 257/698 |
| 59-125642 | 7/1984 | Japan | 257/698 |
| 1-135056 | 5/1989 | Japan | 257/697 |
| 2-58257 | 2/1990 | Japan | 257/700 |
| 2-268456 | 11/1990 | Japan . | |
| 4-10559 | 1/1992 | Japan | 257/697 |
| 4-164359 | 6/1992 | Japan | 257/697 |
| 5-129366 | 5/1993 | Japan | 257/786 |

OTHER PUBLICATIONS

IBM Technical Disclosure Bulletin "Pin/Chip Carrier Assembly" by Jensen et al. vol. 23 No. 9 p. 400, Feb. 1981.

*Primary Examiner*—Donald Sparks
*Attorney, Agent, or Firm*—Louis J. Hoffman

[57] ABSTRACT

Assemblies and methods for interconnecting integrated circuits, particularly prepackaged ones, are disclosed. A multi-level electrical assembly—composed of a pin carrier, a set of pads, such as for receiving a surface-mounted integrated circuit, and a set of conductive pathways coupling the pads and the pins—can connect one or more integrated circuits to the socket or other attachment area of a circuit board. The pathways pass through a multi-layered interconnect board, which can be configured to permit any translation of pads to pins for different purposes, or to permit the coupling of additional circuit elements, such as a coprocessor or passive circuits, to the pathways. Inventive methods for forming the assemblies, and inventive systems in which the embodiment of the assembly can be used to increase circuit board density, are also disclosed.

18 Claims, 8 Drawing Sheets

U.S. PATENT DOCUMENTS

| | | | |
|---|---|---|---|
| 5,126,818 | 6/1992 | Takami et al. | 257/723 |
| 5,168,432 | 12/1992 | Murphy et al. | 361/813 |
| 5,184,285 | 2/1993 | Murphy et al. | 361/813 |
| 5,251,107 | 10/1993 | Takemura et al. | 174/52.4 |
| 5,257,165 | 10/1993 | Chiang | 361/748 |
| 5,258,648 | 11/1993 | Lin | 257/778 |
| 5,289,346 | 2/1994 | Carey et al. | 257/777 |
| 5,379,191 | 1/1995 | Carey et al. | 361/777 |
| 5,513,076 | 4/1996 | Werther | 361/784 |
| 5,515,241 | 5/1996 | Werther | 361/784 |
| 5,625,944 | 5/1997 | Werther | 29/628 |

SPACE-SAVING ASSEMBLIES FOR CONNECTING INTEGRATED CIRCUITS TO CIRCUIT BOARDS

This is a division of application Ser. No. 07/998,476, filed Dec. 30, 1992, now U.S. Pat. No. 5,479,319.

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights.

BACKGROUND OF THE INVENTION

This invention relates to systems and methods for connecting integrated circuits to circuit boards in a flexible and dense manner.

In a variety of situations, economic or functional considerations make it desirable to alter the set of integrated circuits used on a circuit board, such as in a personal or other computer. For example, it may become useful to add a new integrated circuit or to replace or alter the packaging of an existing integrated circuit. However, such changes are often difficult to achieve, because computer circuit boards are typically pre-designed for a particular set of integrated circuits. Thus, altering the set of integrated circuits often requires a board redesign, which can result in significant added costs, delays, or compatibility problems. Consequently, manufacturers often forego changes to the chip set, even if they would result in improved performance or reduce costs.

One particular instance in which it is desirable to use a different chip set but in which the difficulties of redesigning the board stand as obstacles, is the decision to alter the packaging of prepackaged, mass-produced integrated circuits. During the lifetime of such a chip, there may be several phases of packaging, and the best choice may also change over time, as detailed below.

Mass-market prepackaged semiconductor chips often use pin grid array ("PGA") packages, which have metal leads extending from the bottom surface of the package as rows of pins. The array of pins in PGA packages permits a large number of leads, which is essential for complex circuits with high input-output requirements. PGA packages typically allow more leads than alternatives such as dual in-line packages (which have two rows of pins along the edge of the package). A variety of PGA packages are described in my U.S. Pat. No. 4,750,092, which is hereby incorporated by reference.

High-volume, complex, prepackaged semiconductor chips, such as microprocessors, are typically introduced in a ceramic PGA package, even though that package type is relatively costly. Although ceramics have certain other advantages, such as good hermetic sealing, chip makers are principally willing to suffer the cost penalty of ceramics in early stages of chip sales because the packaged chip can be assembled onto circuit boards by virtually all board designers.

As chip volumes increase and chip manufacturing costs drop, chip makers generally look for ways to reduce the package cost. Often, they will begin offering a packaging option of plastic surface-mounted geometry, such as the plastic leaded chip carrier ("PLCC") or the plastic quad flat package ("PQFP"). Those surface-mounted packaging options can reduce the cost of the package by perhaps 30–70%, which can result in a packaged circuit, such as a microprocessor, that sells for 10–50% less than the ceramic-PGA-packaged version.

Unfortunately, not all chip purchasers have the capability and desire to take advantage of the lower-priced, plastic, surface-mounted packages. Some lack the surface-mounting equipment or technical knowledge to use a surface-mounted package. Others cannot or would not find it cost-effective to redesign their circuit board to accommodate the different "footprint" required by a surface-mounted package. Still others are discouraged by the disadvantages of surface-mounting using surface-mount packages, such as the cost of a fine-pitch socket (to which the surface-mounted package might need to be attached), the complications that can arise in board assembly when using surface-mounting for some circuits (as opposed to the ease of through-hole mounting of PGA packages), or the difficulty in testing installed surface-mounted circuits and replacing faulty ones.

No previously existing devices or methods exist to install the lower-cost surface-mounted chips on a circuit board without altering the board layout or increasing the difficulty of the installation and testing process from that common to the use of PGAs. Previous packaging techniques, therefore, have forced users incapable of surface mounting themselves to pay for the higher-cost PGA-packaged semiconductors.

Another problem with previous packaging techniques has been the difficulty in reliably assembling the package and affixing it to the circuit board, and with inspecting the connections. It would be desirable to be able to inspect the assembled device separately, before the circuit board is completed. Those goals are difficult with surface-mount techniques, because the packaged chip must be soldered directly to the circuit board, which can be difficult both to accomplish and to inspect electrically until the board is completed. PGA packages are easier to install because they simply plug in the board, and they can be tested before installation by plugging them into a test board. It has been difficult heretofore to make and inspect, however, the contact between each pin and the conductive pattern bonded out from the semiconductor chip.

Another instance in which it is desirable to use a different chip set but in which the difficulties of redesigning the board stand as obstacles, is the decision to add a coprocessor circuit, or another circuit that can be used with an integrated circuit such as additional memory, to the existing chip set. The optimal choice may change across a customer base or over time, as described below.

It has been common to place the circuitry to perform certain functions in a computer's CPU—typically functions that are not "core" ones or that may be needed at varying levels of performance—on separate chips from the microprocessor. Such chip, called "coprocessors," have commonly included mathematical coprocessors or graphical coprocessors. Often, the end user is permitted to purchase the coprocessor separately, if accelerated performance or added functions are needed. It is not uncommon for some users to select the coprocessor upon purchasing the computer, for others to purchase and have it installed after purchase, and for yet others to skip it entirely.

Such flexibility results in increased cost and trouble for the board designer, though. If any subset of customers will demand the coprocessor, the board designer must include a board location (typically a socket) for it in the design of the circuit board. Designing in a socket is costly in board space, particularly for a feature that only certain customers, perhaps even a minority, will use. If some customers will demand the coprocessor later on, it is not even possible to use two different board designs, one with the coprocessor and the other without, but even if that option were possible, it is costly. No current packaging or design techniques permit a single design for both types of systems, those with and those without coprocessors.

A final example of an instance in which it is desirable but difficult to alter the chip set, is the desirability of providing sockets or circuit board locations that are suitable for any of an interchangeable set of components. For example, some boards can be upgraded to a higher-powered microprocessor in a series merely by unplugging the old one and replacing it with a new one. Previous techniques for achieving such compatibility, however, have depended on the use by the chip maker of a common "pinout," where the pins on each of the interchangeable chips perform the same function. A truly flexible interchangeable system would permit compatibility with a wide variety of components, even ones with different pinouts.

In addition, the invention has application in general circuit board design, in which the problem is not increased flexibility, but increased circuit density. Previous attempts to increase circuit board density by creating circuit board modules supporting chip sets or multi-level circuit boards have failed to produce reasonable-cost results. Common problems have included the failure of such techniques to use standardized components or the need for special materials or fabrication techniques. Furthermore, none of the previous packaging methods including PGA and surface-mount technology, have addressed the need to pack chips on the circuit board closer together without giving up the cost advantages of prepackaged, generally available, or standard chip components. Improved packing techniques can also lead to certain collateral benefits, including improving testing and manufacturability of the board assembly.

SUMMARY OF THE INVENTION

It is an object of the invention, therefore, to provide new and improved devices and methods for permitting increased flexibility in circuit board design.

It is another object of the invention to provide new and improved devices and methods for improving the interchangeability of integrated circuits.

It is another object of the invention to provide new and improved devices and methods for allowing the installation of circuits that can be used with an existing integrated circuit, such as coprocessors, without requiring added board space.

It is another object of the invention to provide new and improved devices and methods for installing a surface-mount packaged semiconductor chip in a circuit board designed for a PGA package of the same chip.

It is another object of the invention to provide new and improved devices and methods for using low-cost, surface-mounted, prepackaged chips in a variety of new applications for which they were previously unsuitable.

It is another object of the invention to provide new and improved devices and methods for mounting prepackaged components on circuit boards.

It is another object of the invention to provide new and improved devices and methods for reducing the difficulty and cost of installing and testing a surface-mounted prepackaged chip.

It is another object of the invention to provide new and improved devices and methods for improving the inspectability and reliability of pin contacts on PGA packages.

It is another object of the invention to provide new and improved devices and methods for permitting reduced overall cost of purchasing, installing, and testing complex prepackaged semiconductor integrated circuits.

It is another object of the invention to provide new and improved devices and methods for reducing the circuit-board area required to mount prepackaged chips.

It is another object of the invention to provide new and improved devices and methods for improving the interchangeability of prepackaged components in a single board location.

It is another object of the invention to provide new and improved devices and methods for mounting and testing chip sets.

It is another object of the invention to provide new and improved devices and methods for manufacturing and utilizing low-cost, multi-level circuit boards.

It is another object of the invention to provide new and improved devices and methods for mating a pin set and pads on a connecting circuit board.

It is another object of the invention to provide new and improved devices and methods for translating the leads from a circuit to the socket of a circuit board.

The above and other objects are achieved in the devices and methods of the invention by the use of a multi-level electrical assembly for coupling one or more integrated circuits to a socket or other attachment area of a circuit board. The assembly includes at least one interconnect board, which may be double-sided or multi-layered, and a pin carrier holding an array of electrically conductive pins aligned with the socket. Sets of contacts, pathways, and receiving means form a plurality of electrical connections from the pins to the integrated circuit, passing through the board.

In one form, the interconnect board has a top surface on which is located a series of pads for surface-mounting one or more prepackaged integrated circuits, and on the bottom surface of which is located pin contacts in a grid array. Conductive leads along the surfaces or in intermediate layers, and conductive vias between the layers, connect each pad with one or more pin contact. Such an interconnect board serves as a translation device, connecting the pads and the contacts in any desired fashion.

In another form, an interconnect board is placed between the pin carrier and the circuit board onto which the assembly is designed to be mounted. The pin array passes through holes in the interconnect board, and contacts can be made between the pins and conductive material in the holes. In that form or a similar embodiment, the IC can be mounted on receptacles or pads supported by the carrier, and the receptacles are in turn can be coupled to the pins. The interconnect board can support one or more secondary electrical components, such as a coprocessor for use with a main IC mounted on top of the assembly, or a passive component such as a capacitor or heat sink, and the electrical pathways can extend through the board to couple the secondary electrical components to the pins and receptacles. The two forms of the invention just described can be utilized together, by having two interconnect boards, one placed on top of the carrier and supporting a surface-mounted IC, such as a microprocessor, and the other placed below the carrier and supporting another circuit, such as a mathematical coprocessor.

Another aspect of the invention consists of the placement of the tops of through-hole-mounted pins in a plastic pin carrier, which is mated to the bottom of the interconnect board, creating a low-cost PGA carrier that can use lower-cost surface-mounted components.

The above and other objects are also achieved in yet other aspects of the invention through the use of (i) locator posts on the pin carrier to effectuate a reliable blind contact between the top of the pins and the pin contacts, (ii) press-fitted pins to permit the temporary movement of the plastic carrier to facilitate inspection of the joints, and (iii) soldering methods and materials designed to permit solid joints without warping.

The invention permits the use of surface-mounted components in circuit board applications for which a PGA footprint is desired, already designed, smaller, or more cost-effective. The invention can also prevent the need to redesign circuit boards when a new package is released.

In accordance with an aspect of the present invention, both the PGA pin contacts and the surface-mount contacts can be inspected simply and easily, without the need to complete the circuit board assembly in its entirety. The assembled unit comprising the mounted prepackaged component, the interconnect board, and the pin carrier can be tested and plugged into the board as easily as if it were a simple, PGA packaged component. Thus, use of the invention can reduce the cost of the overall mounting solution, taking into account component, assembly, and testing costs.

Yet another aspect of the invention permits denser circuit-board packing by allowing for a reduced footprint, because the pins can be located directly below the semiconductor chip, which cannot be done effectively with surface-mounting directly onto a circuit board, and because the attachment areas can be located any place, or at several places, remote from the mounted chip. Moreover, if desired, the interconnect board can support several prepackaged chips, all of which can be connected to each other or, through a set of pins, to other circuits on the main board. In effect, the interconnect board and the main board can comprise two layers of a multi-level circuit board, and additional layers can be added if needed.

Yet another aspect of the invention permits the design of a PGA socket on the main board that can accommodate any of an arbitrary number of interchangeable components that perform similar functions. The socket can be utilized by any component, regardless of manufacturer or pinout, merely by designing a suitable interconnect board.

Other aspects of the invention will be appreciated by those skilled in the art after reviewing the following detailed description of the invention.

BRIEF DESCRIPTION OF THE DRAWINGS

The novel features of the invention are described with particularity in the claims. The invention, together with its objects and advantages, will be better understood after referring to the following description and the accompanying figures. Throughout the figures, a common reference numeral is intended to refer to the same element.

DETAILED DESCRIPTION

Figure 1:
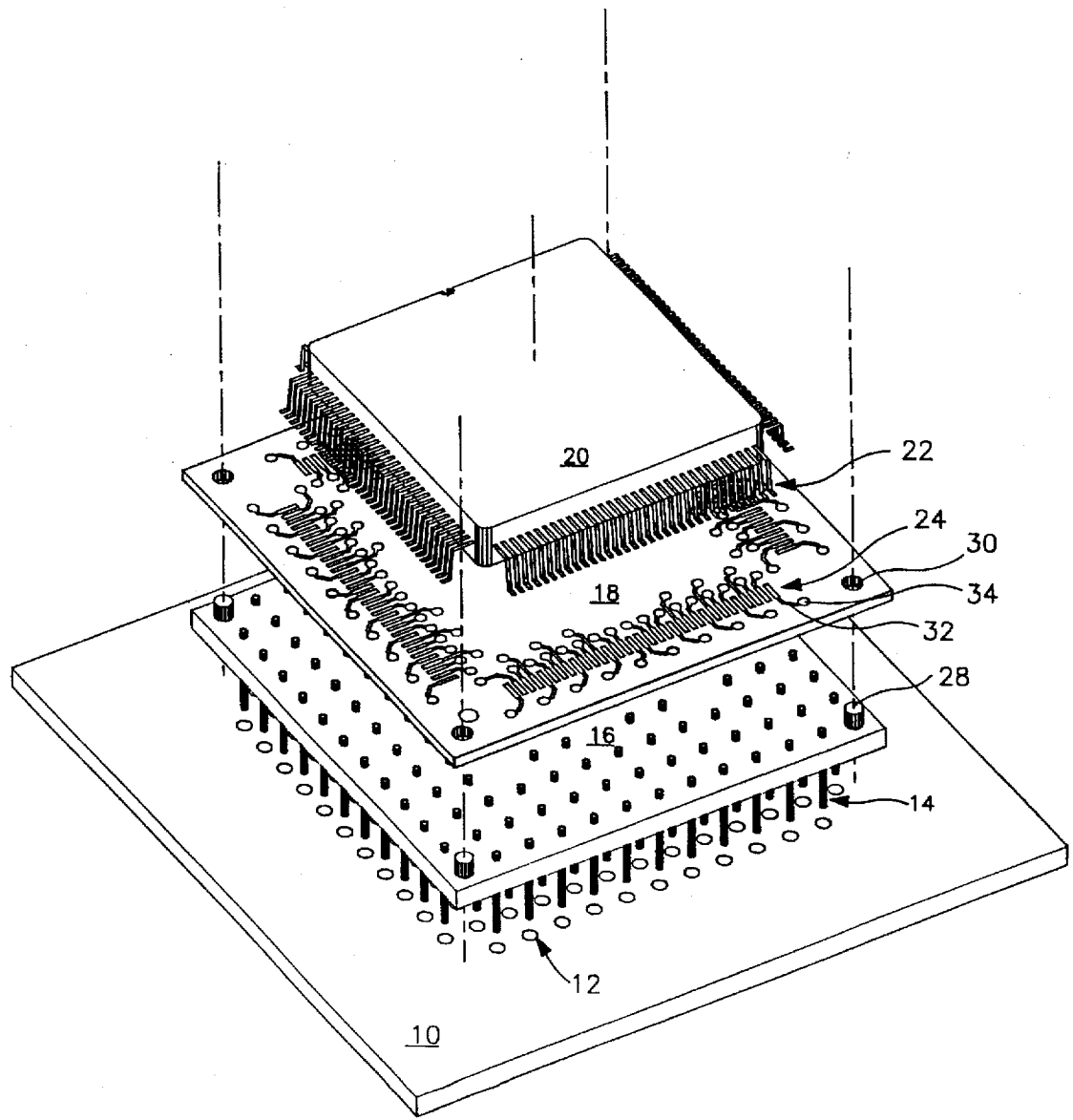
FIG. 1 illustrates, in exploded, front-quarter, perspective view, one embodiment of the invention, including a portion of the circuit board on which it is assembled and the surface-mounted, prepackaged component that it supports.

FIG. 1 shows an embodiment of the invention comprising an interconnect adaptor for connecting a surface-mounted integrated circuit to a PGA socket. Board 10 is a printed circuit board of standard design, which may extend beyond the portion shown, and which may have printed metallization to electrically connect the IC and the adaptor of the invention to other circuitry. Attachment area 12 of board 10 comprises a socket or other similar means for attaching pin grid array 14 to board 10.

Pin carrier 16 holds the plurality of pins making up array 14 in place, aligning the pins with the corresponding receptacles in attachment area 12. Pin carrier 16 is preferably composed of a plastic material, and pins 14 extend completely through pin carrier 16.

Interconnect board 18 is made of a nonconductive substrate, such as epoxy or other standard circuit board materials. Board 18 mates with pin carrier 16 in the embodiment shown and supports integrated circuit 20. IC 20 can be surface mounted using standard mounting techniques on interconnect board 18 by bonding its leads 22 to electrically conductive receiving means, such as pads 24 of board 18, shown in FIG. 1 near all four edges of the top surface of interconnect board 18.

Figure 2:
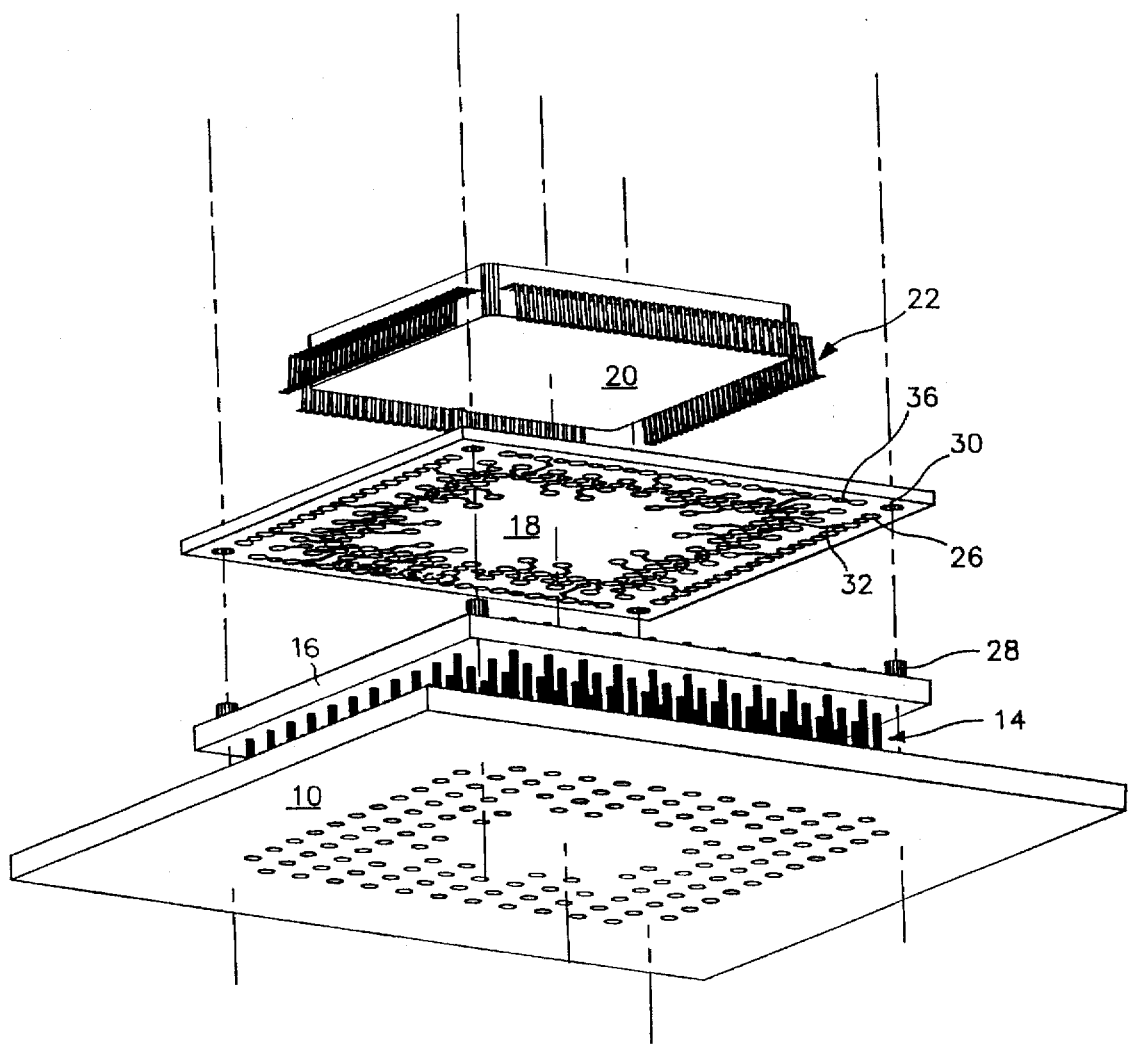
FIG. 2 illustrates an exploded, bottom-quarter, perspective view of the embodiment of FIG. 1.

FIG. 2, which is a bottom perspective view of the embodiment of FIG. 1, shows contacts 26 on the bottom of interconnect board 18, which fit against the top ends of pins 14 when interconnect board 18 and pin carrier 16 are mated together. In the embodiment shown, each pin in array 14 is aligned with one of contacts 26.

Both FIGS. 1 and 2 show locator posts 28 formed on each corner of pin carrier 16, which fit into holes 30 of interconnect board 18 when board 18 and pin carrier 16 are fitted together. It is preferred to use locator posts 28 and holes 30 as measurement markers, so that each pin 14 can be placed relative to posts 28 and each contact 26 can be placed relative to holes 30, thereby permitting accurate alignment of PGA 14 to contacts 26. At least two post-hole pairs are needed for that purpose, although three or four pairs are preferred. The post-hole pairs can be located in any portion of the surface area that is not used for other circuitry. The plan-view drawings of FIG. 3 illustrate a three-post arrangement, with the posts located closer to the center of the assembly than the embodiment in FIGS. 1 and 2.

In the embodiment shown in FIGS. 1 and 2, each contact 26 on the bottom of interconnect board 18, which is coupled to one of pins 14, is also electrically coupled to a single pad 24 on the top of interconnect board 18, which is coupled to a lead 22 of IC 20. Contacts 26 and pads 24 are coupled through a series of pathways of metal or other conductive material that are printed on the surfaces, and in intermediate layers, of interconnect board 18. End leads 32 of those pathways are visible in FIGS. 1 and 2, on the top and bottom layers of board 18, respectively. Intermediate leads 34 on intermediate layers of board 18 are shown in the plan views of those layers, in FIG. 3. The pathways also include vias 36 interconnecting the various layers of board 18.

Alternatively, an electrical pathway, comprised of leads 32 and 34 and vias 36, can connect any single contact 26 or group of contacts 26 to any single pad 24 or any group of pads 24. Thus, interconnect board 18 can support an arbitrary interconnection pattern of pins 14 to leads 22 of IC 20. Moreover, if desired, by the mere absence of a pathway connection, the interconnection pattern can even isolate certain of those pins or leads.

Figure 3:
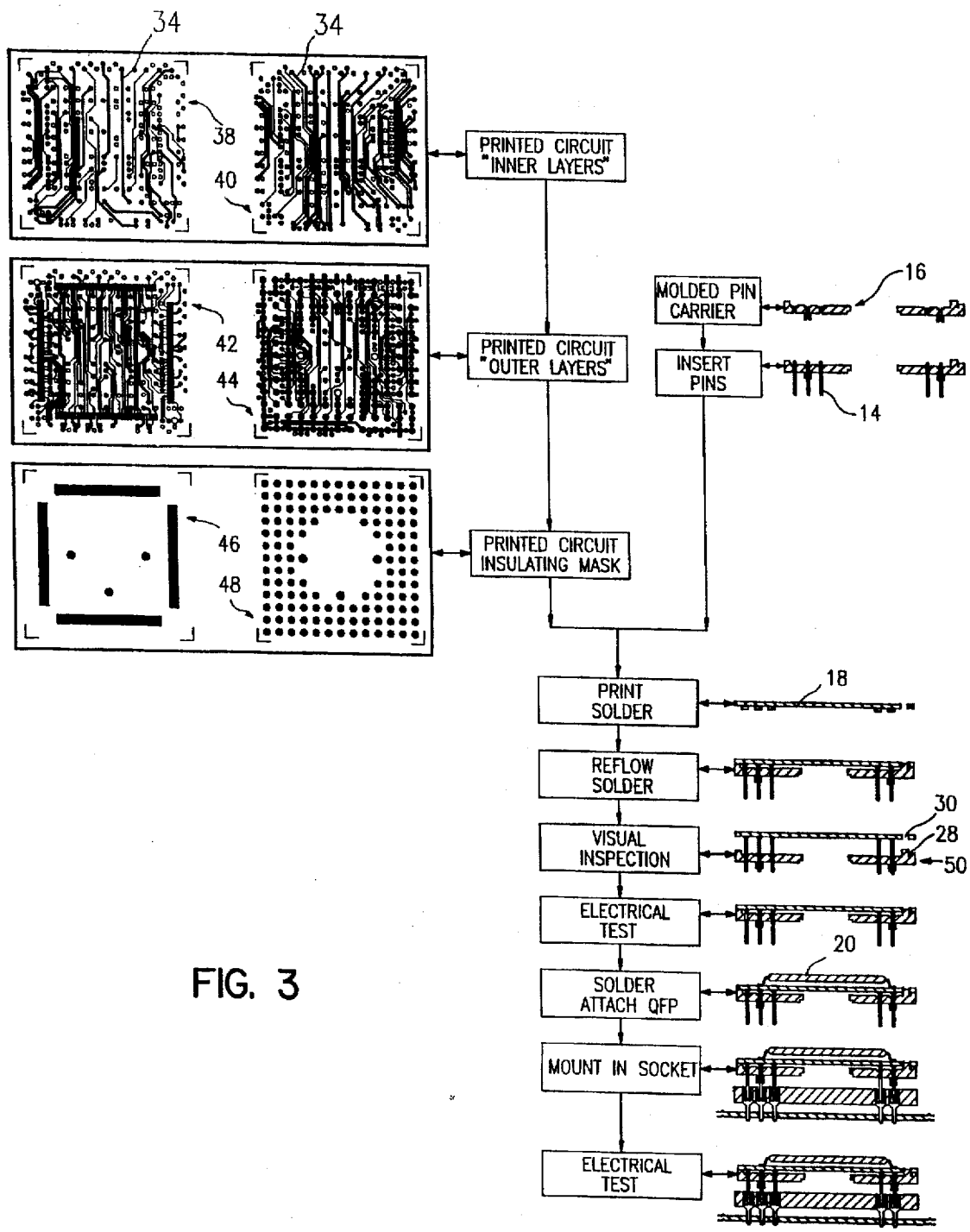
FIG. 3 illustrates, using a flowchart and an accompanying sequence of plan and cross-sectional views, a method of assembling the elements of the invention illustrated in FIGS. 1 and 2.

Interconnect board 18 may contain as many intermediate layers as desired or needed, but four are shown in the embodiment illustrated in FIG. 3. If the interconnection pattern desired is quite simple, it may be possible to construct a board with only two layers of conductive matter, one on each surface of the board. More complex interconnection patterns would likely require additional structure, such as in intermediate layers of board 18.

Layers of interconnect board 18 can be used also to enhance the electrical performance of the assembly in ways other than merely providing a series of interconnecting pathways. For example, layers of board 18 can be assigned for the isolation of power and ground, or used for capacitance.

The embodiment illustrated translates the bond-out lead pattern of IC 20, which is a "quad flat package (QFP)" design, to the PGA pattern of socket 12 in circuit board 10. With certain mass-marketed ICs that are available in both PGA and surface-mount packages, the PGA "footprint" is of substantially different size or configuration than the surface-mount "footprint." The adaptor of the embodiment of the invention shown corrects for that difference, allowing the board designer to keep the PGA socket but use the surface-mounted version of IC 20. For example, in the case illustrated, which is for an actual IC in common use, the PGA pin locations in the PGA version of the IC are relatively far from the leads of the surface-mounted version of the same IC, as can be seen by examining the complex routing pattern in the intermediate layers shown in FIG. 3. Nevertheless, the IC, when surface-mounted on the adaptor of the invention, can be plugged into a socket designed for the PGA version of that IC.

The interconnect adaptor will have particular usefulness for that application whenever the cost savings from using cheaper, surface-mounted IC packages exceeds the cost of the adaptor. However, there are also other benefits. Application of the inventive interconnect adaptor allows the board manufacturer to achieve the cost savings from using surface-mount packaging while avoiding the testing and manufacturing problems that can arise when surface-mounting ICs directly onto a circuit board. With an interconnect adaptor, it is possible to test the IC before it is mounted on the circuit board, and it is not necessary to retain more-expensive PGA packages to achieve that result. Nor is it necessary to redesign the circuit board to accommodate the different footprint of the surface-mount package.

It is possible to achieve any translation from leads 22 of IC 20 to pins 14, merely by designing an appropriate interconnection pattern in interconnect board 18, by establishing appropriate pathways of the sort described above. It is also possible, therefore, to achieve a variety of functions other than the surface-mount-to-PGA translation described above.

For example, an interconnect adaptor can be designed to permit an IC that is not pin-compatible with a competing IC to replace the competing IC even in circuit boards into which it was not designed. As another example, a board can be designed to permit a more advanced IC to replace an older generation, even if the pin-outs of the two circuits are different. The only limitation on such translations is that the socket must have sufficient pin locations to accommodate the replacement IC. Other applications will become apparent after reviewing the remainder of this specification.

FIG. 3 shows an illustrative process of constructing an assembly similar to the embodiment shown in FIGS. 1 and 2. Multi-level interconnect board is assembled as shown in the upper left area of FIG. 3. First, two faces of a fiberglass core, which has been laminated with epoxy and clad with copper layers, are imaged with etch-resist in the patterns shown in drawings 38 and 40 of FIG. 3, which make up the intermediate layers. The remaining copper is then etched away, leaving the pattern shown, which principally consists of intermediate leads 34. Next, the core is sandwiched between two other cores in which the epoxy has not been cured, copper layers are added to the outside of the sandwich, and the entire stack is laminated together. Holes 30 and vias 36 are drilled through the stack, and the inside surfaces of the vias holes are plated with copper in an electroless bath. Outside layers 42 and 44 are then imaged on the outer copper cladding in the same fashion as were inside layers 38 and 40. Finally, epoxy sealing masks 46 and 48 are applied so as to cover the completed outer layers in most places but not to cover or partially fill holes 30 (which are unplated), pads 24 (to which IC 20 will be mounted), and contacts 26 (against which pins 14 will be pressed). Alternative methods of forming board 18 can be selected from known circuit-board-manufacturing techniques.

Meanwhile, pin carrier 16 is molded of a suitable plastic material, and pins 14 are press-fitted into and through carrier 16. Alternatively, carrier 16 can be insert molded directly around pins 14.

Carrier 16 and interconnect board 18 are mated together through the following sequence of steps. First, solder paste is printed on contacts 26 on the bottom of interconnect board 18. It is preferred to use a low-temperature solder, such as tin-bismuth solder, which flows at a temperature just less than 140° C., and which requires a peak processing temperature usually about 175°–180° C. but in any event below 200° C. Ordinary 60/40 tin-lead solder, by contrast, has a reflow temperature of about 183° C. and would likely be processed at a peak temperature of about 225°–230° C., in any event above 200° C. Low-temperature solder is preferred because the heat-absorption rate and the coefficient of thermal expansion of the plastic in carrier 16 are different from the corresponding values for the substrate material in board 18, which results in warping (such as bowing up of the center of board 18) if the joint between those materials is formed at high temperature and then allowed to cool.

An alternative and preferable embodiment includes the selection of materials for carrier 16 and board 18, such as by choosing a high-temperature thermoplastic such as polyethersulfone for the carrier, so that the difference in thermal expansion will be as small as possible, to reduce the warping effect. Use of such high-temperature-tolerant materials has the added advantage of permitting the use of a higher-than-normal-temperature solder—those with reflow temperatures of greater than 185° C., such as 90/10 tin-lead—which prevents the risk of the soldered joints becoming accidentally disassembled during subsequent high-temperature steps, such as when IC 20 is soldered to the top of the assembly.

Next, board 18 is fitted to carrier 16, by inserting locator posts 28 into holes 30. The solder is reflowed, creating a firm joint coupling contacts 26 and the top ends of pins 14, and the assembly is cooled. As shown in illustration 50 of FIG. 3, it is possible to pull carrier 16 away from board 18, without removing it entirely off of pins 14, to facilitate inspection of the otherwise-blind joint. Alternatively, pins 14 can be originally fitted in carrier 16 in the position shown in illustration 50, avoiding the need to pull it along the pins after the solder-reflow step, although that method delays the use of locator posts 28 for alignment. Another alternative is to manufacture carrier 16 with holes or slots located around each of pins 14, permitting at least partial inspection of the blind joints without the need to pull carrier 16 away from the pins. After inspection, carrier 16 is moved (or returned) to position against board 18, and it is preferred to affix those two elements together with epoxy or another suitable adhesive and sealing material.

The completed assembly can be tested electrically, even before the IC 20 is attached. After successful testing, IC 20 is mounted to pads 24 on the top of the assembly, using standard attachment techniques, and the assembly can be electrically tested again, merely by plugging it into a testing socket. Finally, the completed assembly with the mounted IC can be coupled to socket 12 of circuit board 10, which may comprise a PGA socket or a location to which the assembly can be soldered using, for example, through-hole mounting.

Figure 4:
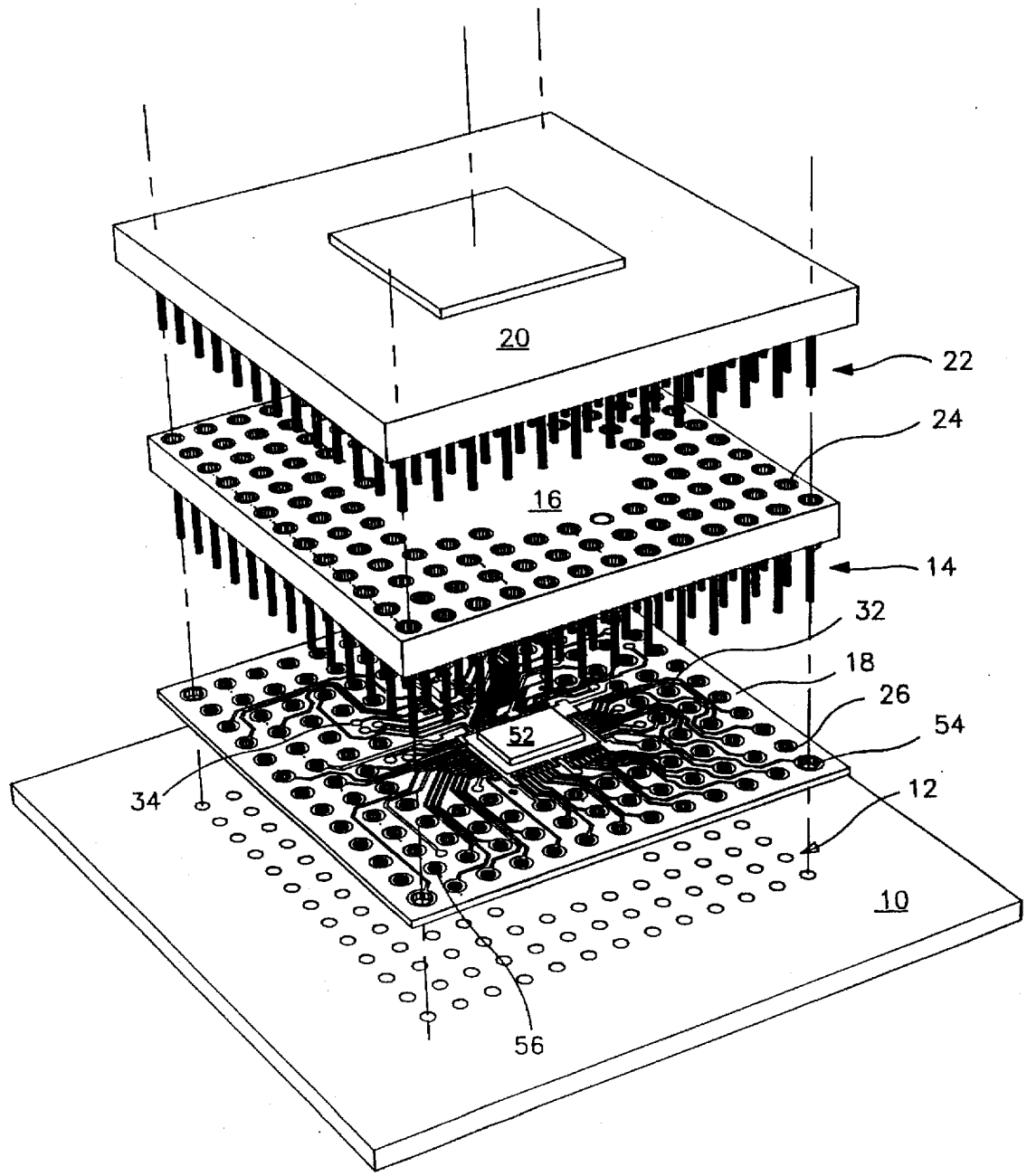
FIG. 4 illustrates, in exploded front-quarter perspective view, another embodiment of the invention, including the integrated circuit that it supports and the associated circuit or coprocessor that it couples.
Figure 5:
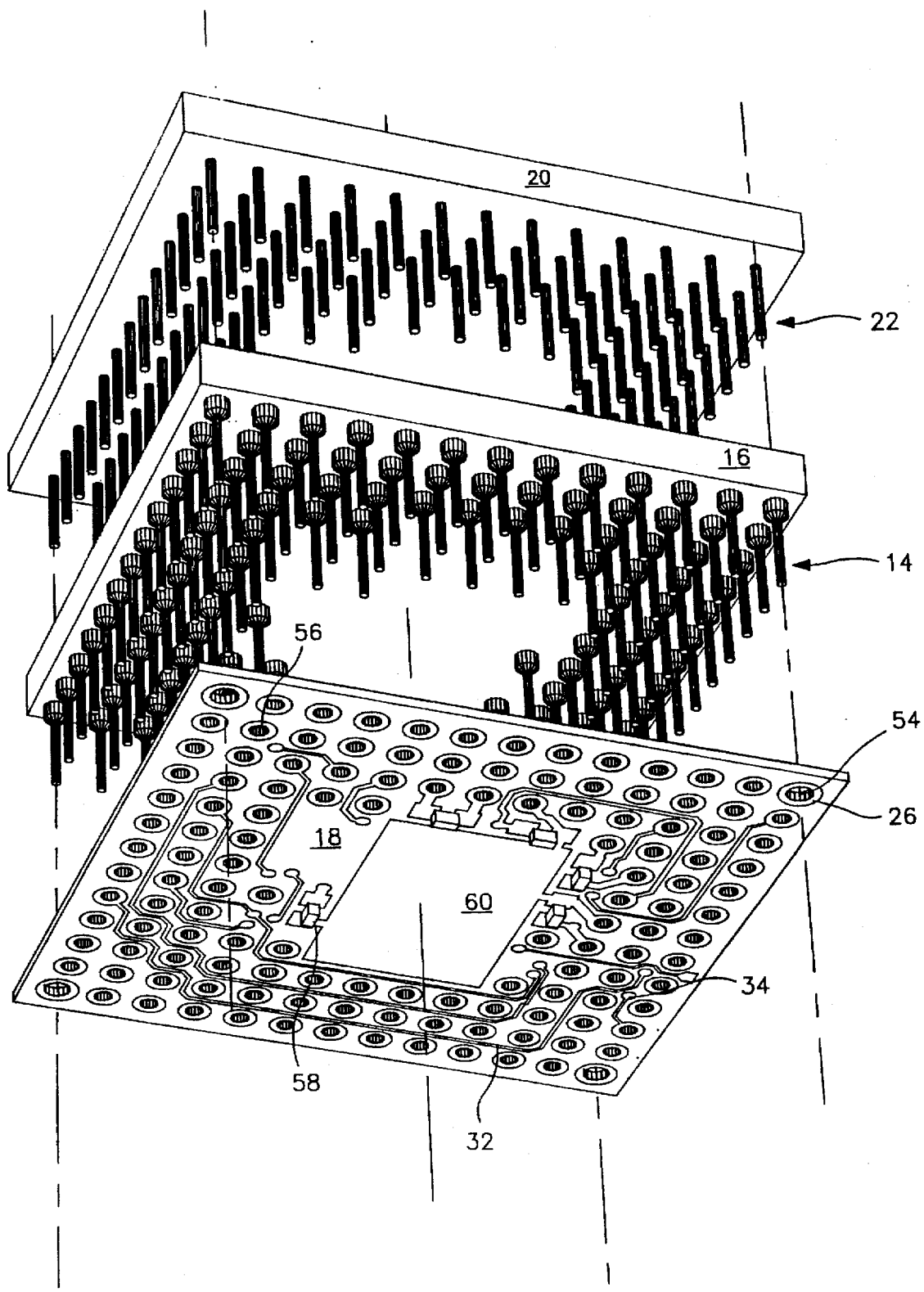
FIG. 5 illustrates an exploded, bottom-quarter, perspective view of the embodiment of FIG. 4.

FIGS. 4 and 5 illustrate an alternative embodiment of the invention, viewed in top and bottom quarter perspective, respectively. In that embodiment, interconnect board 18 is placed in an alternate location and serves a different function, but in both embodiments, board 18 allows greater flexibility in mounting ICs to a fixed socket or other attachment area 12 of a circuit board 10.

The embodiment of FIGS. 4 and 5 illustrates how the inventive assembly can be used to support an additional component, such as a coprocessor, for use with a prepackaged IC 20. IC 20 here is shown as a PGA-packaged chip, which ordinarily could be fitted directly into socket 12. With the inventive adaptor, however, it is possible to add a coprocessor 52 without including another empty socket on or altering the design of circuit board 10. To achieve that result, pin carrier 16 is formed with receiving means placed directly on its upper side and reshaped in the form of receptacles 24 rather than the flat surface-mount-type pads shown in FIG. 1. In FIG. 4 and 5, receptacles 24 are formed as extensions of pins 14, and pin carrier 16 supports both receptacles 24 and pins 14. In addition, receptacles 24 can contain flanges (not shown) in their interior, which help keep leads 22 of IC 20 firmly in place.

Interconnect board 18 in FIGS. 4 and 5 is placed between carrier 16 and board 10, rather than between carrier 16 and IC 20. Consequently, pins 14 must pass though holes 54 in board 18. In the embodiment shown, contacts 26, which are electrically coupled to pins 14, are formed as a layer of conductive material on the inside surfaces of holes 54 through board 18. Locator posts 28 of FIG. 1-3 are unnecessary, as pins 14 and holes 54 assure a well placed connection between carrier 16 and board 18. When assembled, pins 14 are forced into contact with contacts 26 on the inside of holes 54, forming a joint similar to that coupling pins 14 and contacts 26 in FIGS. 1-3. The joint can be soldered after board 18 is fitted over pins 14 and pressed against carrier 16.

In the embodiment shown in FIG. 4, unpackaged coprocessor semiconductor circuit 52, which can be a mathematical coprocessor associated with microprocessor 20, for example, is wire bonded onto board 18, and the circuit and its wire bonds are encapsulated for protection. Alternatively, circuit 52 can be prepackaged, rather than unpackaged, and plugged into or surface-mounted onto board 18 rather than being wire-bonded onto it. Pathways composed of leads 32, vias 34, and optional intermediate-layer leads 36 (as shown in FIG. 3) form electrical connections between circuit 52 and contacts 26. Electrical pathways between pins 14 and IC 20 are formed by the combination of pins 14, contacts 26, receptacles 24, and leads 22. Thus, contacts 26 act as junction points, controlling the electrical contact between any desired lead 22 of IC 20 and any lead 32 extending from coprocessor 52.

If a particular pin 14 must contact only IC 20 but not coprocessor 52, then it is possible to isolate contact 26 from lead 32, as shown in the case of particular contact 56, which is an isolated one of contacts 26. Conversely, if it is desired to have a particular pin 14 contact only coprocessor 52 but not IC 20, it is possible simply to omit the receptacle 24 that would otherwise be coupled to that pin 14. In addition, leads 32 can, if desired, electrically couple several pathways leading either to IC 20 or coprocessor 52, thereby forcing one signal to pass along multiple pins 14 or forcing signals from multiple places to pass along a single pin 14.

Thus, interconnect board 18 permits the arrangement of any desired pattern of electrical interconnection between component 52 and IC 20. Thus, for example, it does not matter where the leads from coprocessor 52 emerge with respect to the pin or pins to which they must be ultimately connected.

In addition, as shown in FIG. 5, interconnect board 18 can support passive circuit elements, such as capacitors 58, heat sink 60, or other elements, such as resistors, transistors, or connectors, along with or instead of circuit 52. Many such passive elements cannot easily be integrated on ICs, but the placement of such elements on board 18 can allow location of such circuits close to the IC itself, which is often preferred. For example, capacitors 58 are frequently used to direct power surges from the leads of the IC, but such surge-protectors can more reliably block power surges, regardless of where along the input line the surge originates, if they are placed close to the protected pin.

Figure 6:
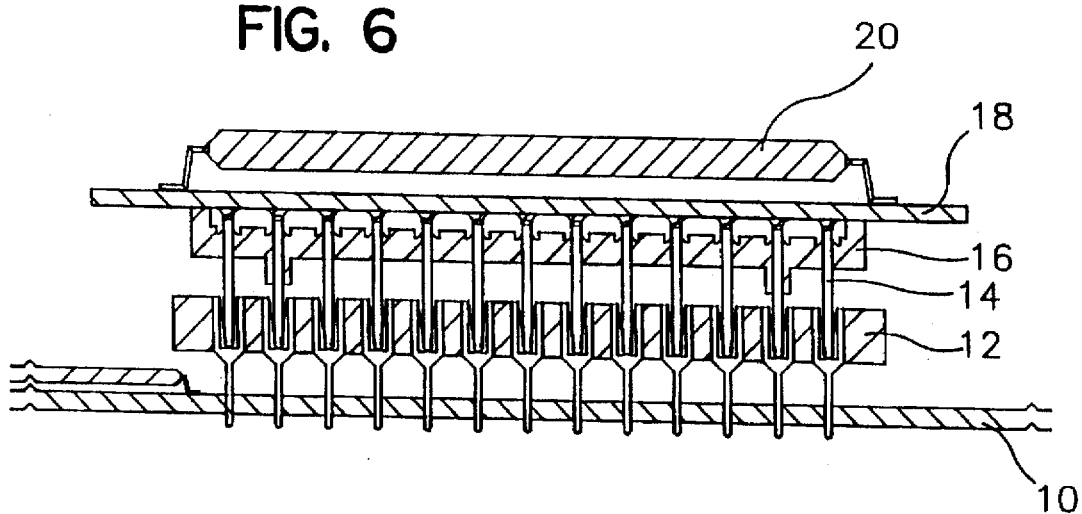
FIG. 6 illustrates a side, cross-sectional view of another embodiment of the invention, intended for use in reducing chip footprints.

In addition, the adaptor can be used to alter or to reduce the "footprint" of the circuit. FIG. 6 shows a side view of an adaptor of similar design to that of FIGS. 1-3 except with different dimensions. In FIG. 6, IC 20 is of a large size compared to socket 12 of board 10, yet interconnect board 18 permits pin array 14 to have the reduced footprint needed to connect to socket 12. Also, socket 12 can be designed with exaggerated height, as shown in FIG. 6, thereby permitting IC 20 to overlap other ICs on board 10 without taking up valuable circuit board surface area. As the cross-section of FIG. 6 can be taken in any direction along board 10, it is apparent that the altered footprint can be achieved in any one or more directions. For example, an appropriate combination of interconnect board 18 and pin carrier 16 can translate a square IC 20 into a rectangular socket 12, or vice versa, without regard to whether the width of the square is shorter than the short side of the rectangle, longer than the long side of the rectangle, or in between the two dimensions.

Figure 7:
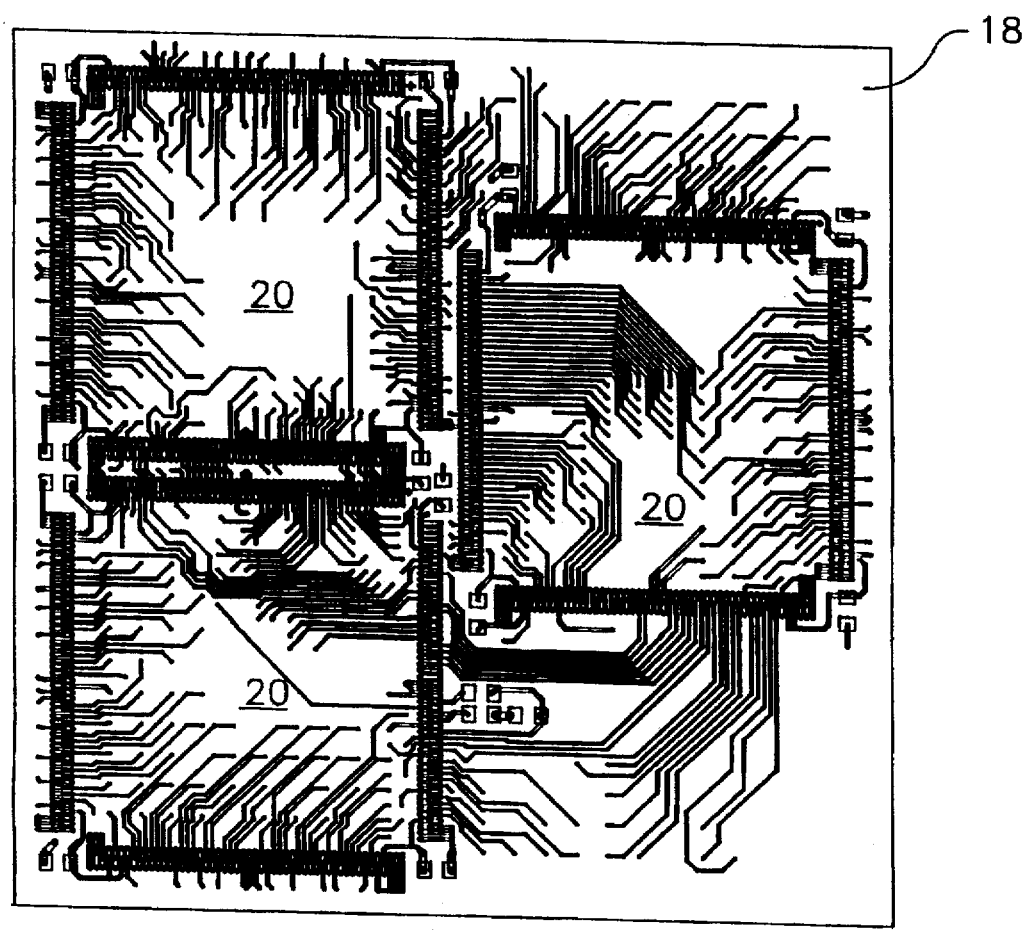
FIG. 7 illustrates a plan view of another embodiment of the invention, in which a chip set is mounted on the interconnect board.

As the top view in the embodiment of FIG. 7 illustrates, interconnect board 18 can support more than one IC 20. The pathways described above can be used to permit direct connections between leads of several of the ICs 20, as illustrated in FIG. 7, as well as connections between one or more of those leads and the PGA. Thus, a particular IC socket can be used to support a collection of ICs, as long as the collection needs no more external connections to the remainder of the circuitry on the primary circuit board than are allowed by the number of pins. The interconnect board can act in that case as a secondary circuit board. When the embodiments of FIGS. 6 and 7 are combined together, it is apparent that the secondary circuit board can be designed of wider dimensions than the socket for the purpose of accommodating a number of ICs, not just one large IC, without taking up circuit board real estate. Use of the interconnect adaptor therefore allows achievement of a practical three-dimensional structure, permitting increased board density.

Figure 8:
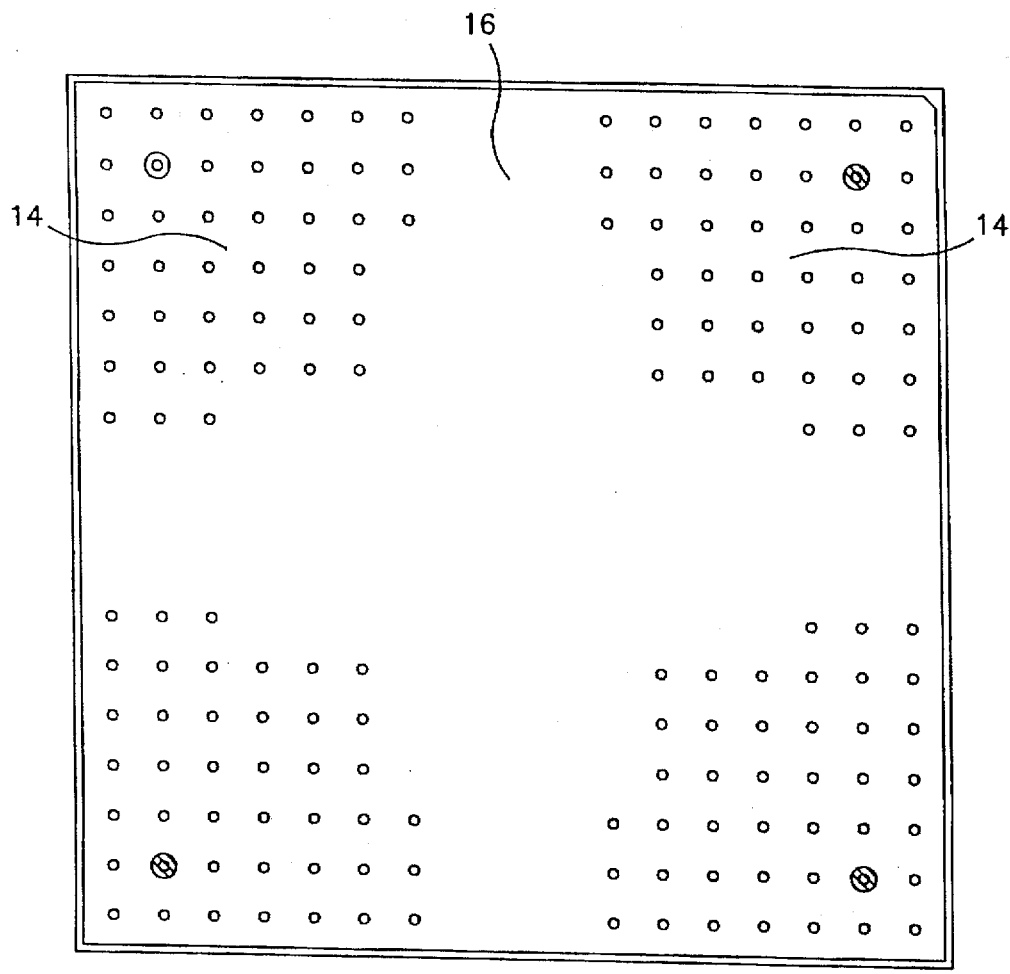
FIG. 8 illustrates a bottom view of another embodiment of the invention, showing an example of a possible pinout.

FIG. 8 illustrates, using a bottom plan view, an alternate footprint for the adaptor, in which a plurality (here, four) of pin grid arrays 14 are coupled to a single pin carrier 16. The structure is designed to be aligned with a matching plurality of attachment areas 12 (not shown) located wherever the remainder of the circuitry on the circuit board permits. When combined with the embodiments of FIGS. 6 and 7, the embodiment of FIG. 8 illustrates an alternative method of supporting a secondary circuit board 18 with a plurality of ICs (as in FIG. 7) above other circuitry on board 10 (as in FIG. 6). The advantages of the embodiment of FIG. 8 are (i) the secondary board can be made more stable for large dimensions, and (ii) the number of pins in arrays 14 can be increased over that shown in FIG. 6. Nevertheless, the embodiment illustrated discloses a "piggyback" board that can be easily plugged or unplugged from circuit board 10, such as to obtain access to board 10 for repairs, to remove board 18 to repair it, or to permit the addition of board 18 as an optional module containing additional circuitry.

Figure 9:
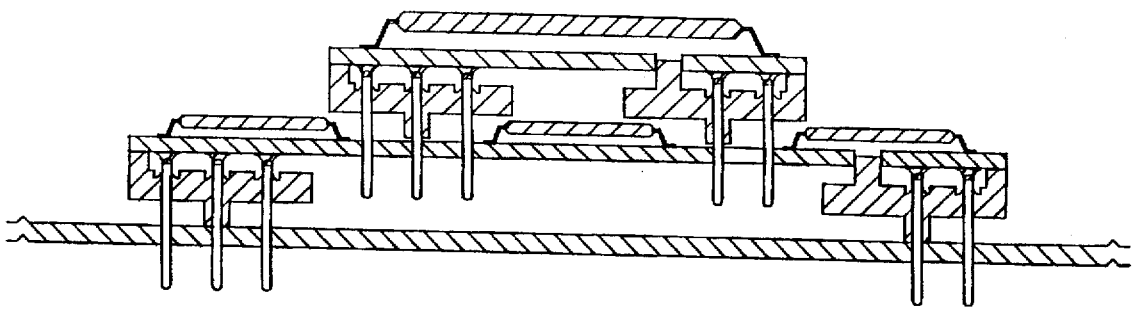
FIG. 9 illustrates, in side, cross-sectional view, a multi-level embodiment of the invention.

FIG. 9 illustrates another embodiment of the invention in which several adaptors of the sort described above are "piggybacked" on top of each other in a multi-layer assembly. Any number of layers can be designed in such a three-dimensional configuration, with appropriate treatment for heat removal, etc., as is known in the art.

Figure 10:
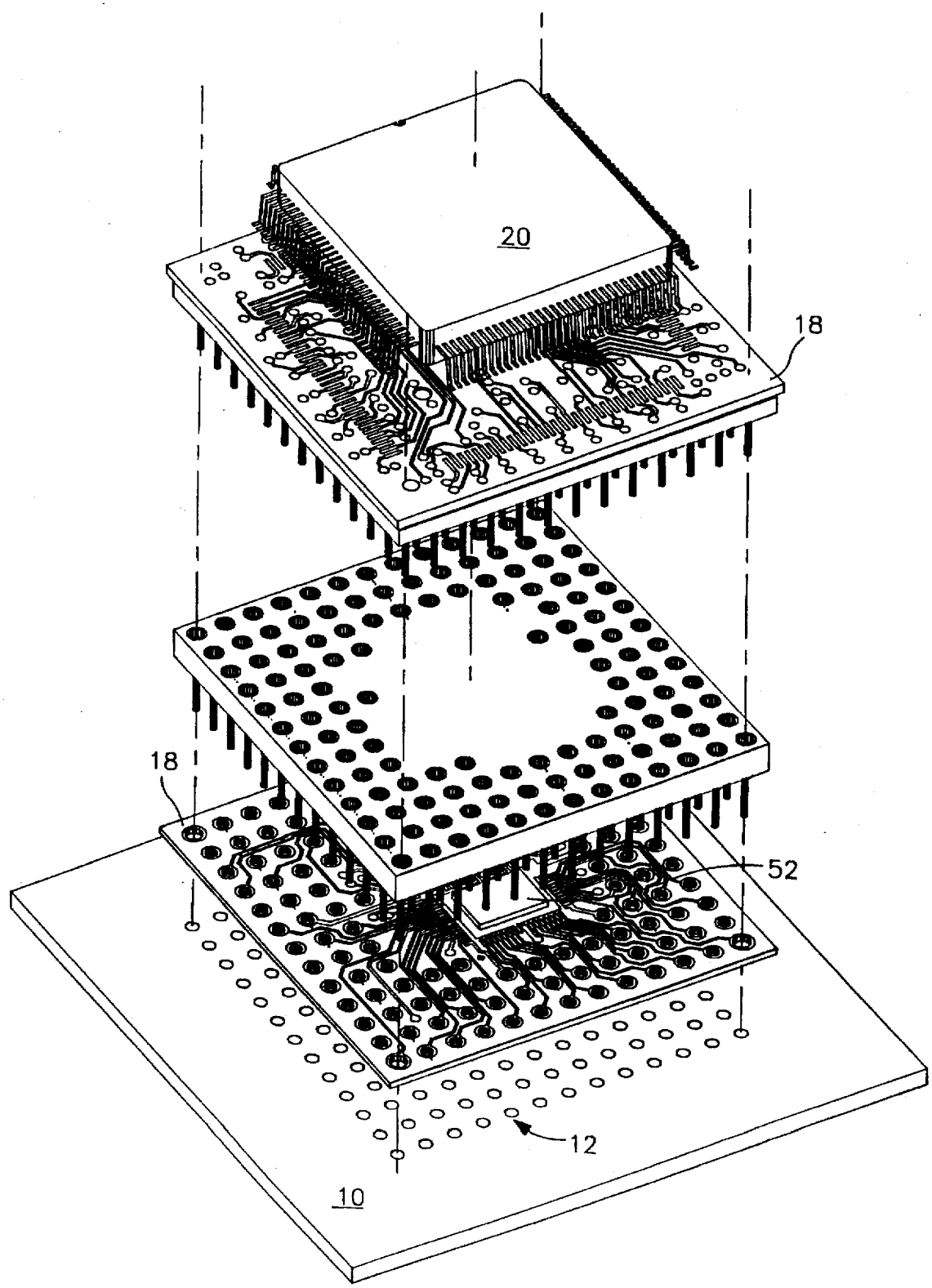
FIG. 10 illustrates another embodiment, which is a combination of the embodiments of FIGS. 1 and 4.

FIG. 10 illustrates a combination of embodiments similar to those shown in FIGS. 1 and 4, in which two interconnect boards 18 are used as part of the same assembly, one to support a coprocessor or other circuit element 52, and the other to permit translation from the surface-mount-packaged IC 20 to PGA socket 12 of board 10. Although the combination shown in FIG. 10 contains two pin carriers, it is possible to omit one of those if desired. The combination allows retention of the above-described advantages of both of the above embodiments. Any of the boards in FIGS. 6–9 can include component-support interconnect boards (described in connection with FIGS. 4 and 5) in addition to the adaptor-type interconnect boards used for translation purposes (described in connection with FIGS. 1–3).

It is understood by those skilled in the art that numerous alternate forms and embodiments of the invention can be devised without departing from its spirit and scope. Features of the invention deemed novel are set forth below in the claims.

I claim:

1. A multi-level electrical assembly for coupling at least one integrated circuit having a plurality of electrically conductive leads to at least one attachment area of a circuit board comprising:

(a) an interconnect board, including an electrically insulating substrate, having a top surface, a flat bottom surface, and two cores;

(b) an electrically insulating pin carrier disposed generally parallel to the interconnect board;

(c) a plurality of electrically conductive pins held by the pin carrier parallel to each other, perpendicular with the pin carrier, and in relative positions predetermined so as to align with receptacles of a circuit board;

(d) a plurality of electrically conductive receiving devices configured to receive leads of an integrated circuit supported on one of the surfaces of the interconnect board;

(e) a plurality of electrically conductive flat pads on the bottom surface of the interconnect board;

(f) wherein the area within a first perimeter line surrounding all of the receiving devices on the surface of the interconnect board that supports the receiving devices is larger than the area within a second perimeter line surrounding all of the flat pads on the bottom surface of the interconnect board;

(g) a plurality of contacts electrically coupling ends of selected of the pins to the pads and physically holding the pin ends against the pads, wherein no portion of the pins extends beyond the flat bottom surface of the interconnect board; and (h) a plurality of electrically conductive pathways, at least in part supported by the interconnect board, at least some of which pathways electrically couple at least one of the contacts to at least one of the receiving devices;

(i) wherein the electrically conductive pathways form three distinct pattern on (1) two exterior surfaces of the board having conductive material disposed on selected lateral regions of each, and (2) at least one buried surface between the cores having conductive material disposed in selected lateral regions and (j) wherein the electrically conductive pathways include a plurality of conductive vias connecting conductive material of the exterior surfaces with conductive material of the buried surface.

2. The assembly of claim 1 wherein the plurality of pins are divided into a plurality of space-separated, regular arrays in relative positions predetermined so as to align with receptacles of each of a plurality of separated attachment areas on the circuit board.

3. The assembly of claim 1 including receiving devices situated to electrically couple and physically support a plurality of integrated circuits, each circuit on a plurality of pads, and further comprising second electrically conductive pathways between certain of the pads associated with one of the integrated circuits and certain of the pads associated with another of the integrated circuits.

4. The assembly of claim 1 wherein at least some of the pathways couple one pad to more than one of the receiving devices.

5. The assembly of claim 1 wherein the interconnect board contains exactly two cores, such that the electrically conductive pathways form three distinct patterns on (a) the top surface of the board, (b) the bottom surface of the board, and (c) one intermediate surface of the board.

6. The assembly of claim 1 further comprising at least one further electrical component physically coupled to a surface of the interconnect board and electrically coupled to the integrated circuit.

7. The assembly of claim 6 wherein the further electrical component comprises another integrated circuit.

8. A multi-level electrical assembly for coupling at least one integrated circuit having a plurality of electrically conductive leads to at least one attachment area of a circuit board comprising:

(a) an interconnect board, including an electrically insulating substrate, having a top surface, a flat bottom surface, and two cores;

(b) an electrically insulating pin carrier disposed generally parallel to the interconnect board;

(c) a plurality of electrically conductive pins held by the pin carrier parallel to each other, perpendicular with the pin carrier, and in relative positions predetermined so as to align with receptacles of a circuit board;

(d) a plurality of electrically conductive receiving devices configured to receive leads of an integrated circuit supported on one of the surfaces of the interconnect board;

(e) a plurality of electrically conductive flat pads on the bottom surface of the interconnect board;

(f) wherein the distance, on the surface of the interconnect board that supports the receiving devices, between the two receiving devices that are farthest apart from each other is greater than the distance on the bottom surface of the interconnect board between the two pads that are farthest apart from each other;

(g) a plurality of contacts electrically coupling ends of selected of the pins to the pads and physically holding the pin ends against the pads, wherein no portion of the pins extends beyond the flat bottom surface of the interconnect board; and (h) a plurality of electrically conductive pathways, at least in part supported by the interconnect board, at least some of which pathways electrically couple at least one of the contacts to at least one of the receiving devices;

(i) wherein the electrically conductive pathways form three distinct patterns on (1) two exterior surfaces of the board having conductive material disposed on selected lateral regions of each, and (2) at least one buried surface between the cores having conductive material disposed in selected lateral regions; and (j) wherein the electrically conductive pathways include a plurality of conductive vias connecting conductive material of the exterior surfaces with conductive material of the buried surface.

9. The assembly of claim 8 wherein the area within a first perimeter line surrounding all of the pins is less than the area within a second perimeter line surrounding all of the receiving devices.

10. The assembly of claim 9 wherein the plurality of pins are divided into a plurality of space-separated, regular arrays in relative positions predetermined so as to align with receptacles of each of a plurality of separated attachment areas on the circuit board.

11. The assembly of claim 9 including receiving devices situated to electrically couple and physically support a plurality of integrated circuits, each circuit on a plurality of pads, and further comprising second electrically conductive pathways between certain of the pads associated with one of the integrated circuits and certain of the pads associated with another of the integrated circuits.

12. The assembly of claim 11 further comprising at least one further electrical component physically coupled to a surface of the interconnect board and electrically coupled to the integrated circuit.

13. The assembly of claim 11 wherein at least some of the pathways couple one pad to more than one of the receiving devices.

14. The assembly of claim 8 wherein the interconnect board contains exactly two cores, such that the electrically conductive pathways form three distinct patterns on (a) the top surface of the board, (b) the bottom surface of the board, and (c) one intermediate surface of the board.

15. The assembly of claim 8 wherein the interconnect board is rectangular, and wherein the distances, on the surface of the interconnect board that supports the receiving devices, between the two receiving devices that are farthest apart from each other is greater than the distance on the bottom surface of the interconnect board between the two pads that are farthest apart from each other, in both of two directions perpendicular to edges of the rectangular interconnect board.

16. A multi-level electrical assembly for coupling at least one integrated circuit to a circuit board comprising:

(a) pin carrier means for electrically and mechanically coupling the multi-level electrical assembly to an attachment area of a circuit board, including an array of electrically conductive pins held in predetermined relative position by an electrically insulating carrier;

(b) receiving means located on the top level of the assembly for electrically and mechanically coupling an integrated circuit to the multi-level electrical assembly, including a plurality of pads; and (c) interconnect means comprising two core members positioned substantially flush with ends of the pins for electrically coupling the pins to the pads in a predetermined pattern so that the footprint area formed by the array of pins is smaller than the surface area of the receiving means;

(d) wherein the interconnect means includes electrically conductive pathways forming three distinct patterns on (a) two exterior surfaces of the interconnect means having conductive material disposed on selected lateral regions of each, and (b) at least one buried surface between the cores having conductive material disposed in selected lateral regions; and (e) wherein the interconnect means includes a plurality of conductive vias connecting conductive material of the exterior surfaces with conductive material of the buried surface.

17. The assembly of claim 16 wherein the distance on the top level of the assembly across the receiving means is greater than the distance across the array of pins.

18. The assembly of claim 16 wherein the interconnect means includes a board having exactly two cores, such that the electrically conductive pathways form three distinct patterns on (a) the top surface of the board, (b) the bottom surface of the board, and (c) one intermediate surface of the board.

* * * * *